United States Patent [19]
de Cremoux

[11] 4,037,244
[45] July 19, 1977

[54] AVALANCHE PHOTODIODE

[75] Inventor: Baudouin de Cremoux, Paris, France

[73] Assignee: Thomson-CSF, Paris, France

[21] Appl. No.: 684,382

[22] Filed: May 7, 1976

[30] Foreign Application Priority Data

May 16, 1975 France .................................. 75.15437

[51] Int. Cl.$^2$ .................... H01L 27/14; H01L 29/161
[52] U.S. Cl. ........................................ 357/30; 357/16;
357/13
[58] Field of Search ............................. 357/16, 30, 13

[56] References Cited

U.S. PATENT DOCUMENTS 3,959,646  5/1976  de Cremoux ..................... 250/211 J Primary Examiner—Martin H. Edlow
Attorney, Agent, or Firm—Cushman, Darby & Cushman

[57] ABSTRACT

An avalanche photodiode has an avalanche voltage relatively low. In one of the two elements of the junction there is a zone doped more heavily than said element and having the same conductivity type.

8 Claims, 3 Drawing Figures

AVALANCHE PHOTODIODE

This invention relates to an avalanche photodiode intended for telecommunications by optical fibres.

Avalanche photodiodes have already been used for this purpose. Avalanche photodiodes add an amplifier effect caused by the avalanche to the photodetector effect. Conventional diodes of this kind are made of silicon or germanium.

They have the disadvantage of necessitating a high avalanche voltage of the order of 200 volts and of having a low performance at the wavelength of 0.80 microns which is particularly used in telecommunications.

The object of the present invention is to provide an avalanche photodiode which does not have any of these disadvantages.

The avalanche photodiode according to the invention is of the type comprising a heterojunction, one of the elements of the junction being made of a material which is transparent to the wavelength to be detected, the other being opaque to that wavelength. The avalanche photodiode according to the invention is essentially distinguished by the fact that, between the two elements of the junction there is a region which is doped to a greater extent than the transparent element. This region may be the seat of the avalanche phenomenon without affecting the element in which it is present.

Figure 1:
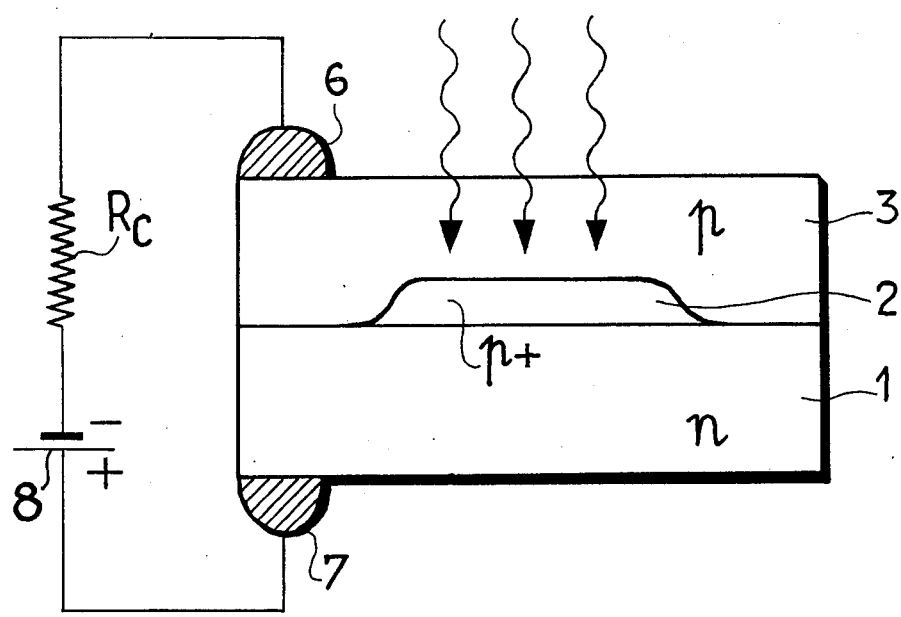

The invention is described in more detail in the following with reference to the accompanying drawings, wherein:

FIG. 1 is a basic diagram of the diode according to the device.

Figure 2:
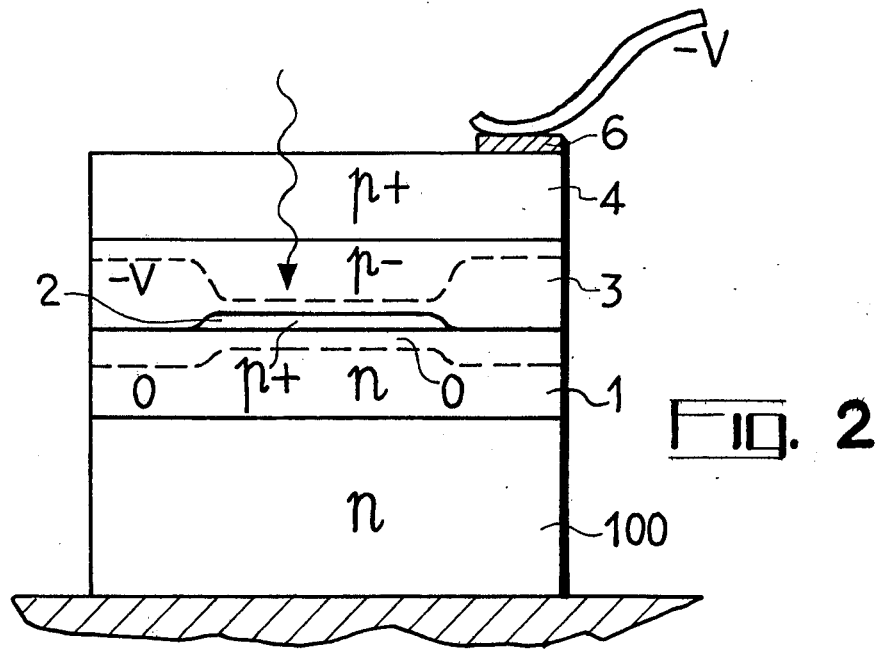

FIG. 2 diagrammatically illustrates a first example of embodiment.

Figure 3:
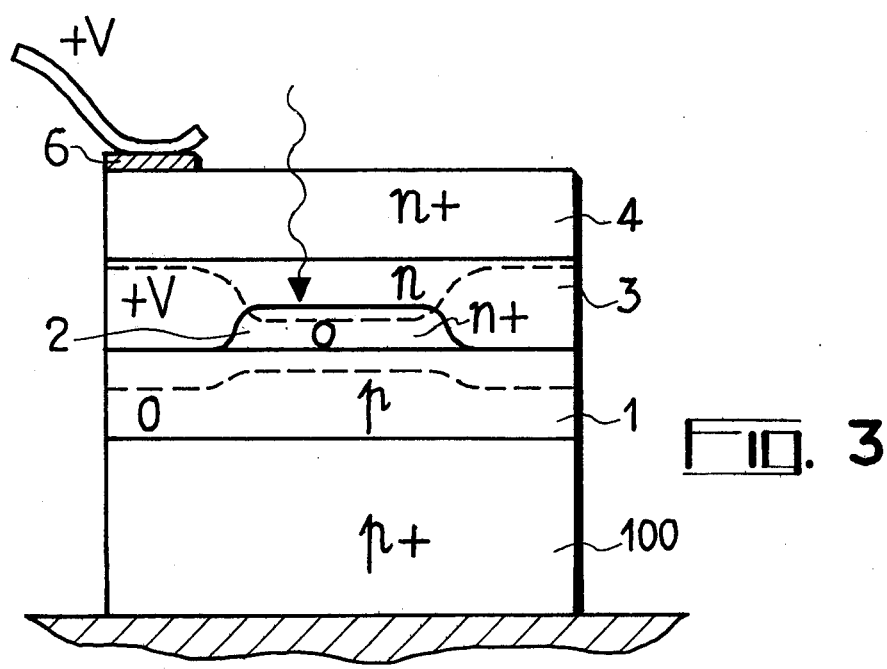

FIG. 3 diagrammatically illustrates a second example of embodiment.

FIG. 1 is a diagram of an avalanche diode according to the invention. It comprises three superimposed layers 1, 2 and 3, the region 2 extending solely in the central zone of the region 3. The region 1 is heavily doped and is of a first conductivity type, zone 3 is lightly doped and is of the conductivity of the zone 2. The end zones 1 and 3 support contacts 6 and 7, respectively, which enable them to be connected to the respective poles of a battery 8, one directly and the other across a load resistance $R_c$.

The biassing source 4 biasses the diode in the backward direction. The zone 3 is directly exposed to the radiation to be detected.

At least one of the materials 1 and 3 is a material with a forbidden band width greater than that of the material 2 so that it is transparent to the radiation to be detected. In the case of FIG. 1, it is the layer 3 which is subjected to the impact of the radiation.

Two arrangements are possible, namely the arrangements shown in FIGS. 2 and 3 in which the phenomena are not strictly identical.

In the first case, FIG. 2, the n-doped layer 1, (doping concentration of the order of $10^{16}$ at/cm$^3$) is deposited upon a substrate 100 of the same conductivity type, this substrate being more heavily doped ($10^{18}$ at/cm$^3$). The layer 2 has a p-type conductivity and is heavily doped ($10^{17}$ to $10^{18}$ at/cm$^3$). The layer 2 has a thickness of the order of 0.1 micron; this thickness is such that the layer 2 is unable to absorb the radiation to be detected. It is inserted into the zone 3 which has a much lower doping concentration and a thickness to the order of 5 microns. A zone 4 of p$^+$ type (doping concentration $10^{19}$ at/cm$^3$), of the order of 5 microns thick, covers the assemblage and carries a contact 6 brought to a potential − V. The substrate is earthed.

The arrangement operates as follows:

The space charge due to the potential − V biassing the diode in reverse direction is limited by the equipotentials 0 and − V. In this case, it is known that the greater the doping of one of the elements of the junction, the lesser the thickness of the space charge zone. This results in the form of the two equipotentials 0 and − V which surround the zone 2 and approach it.

The electrical field is at its maximum at the interface between the region 2 and the region 1.

The radiation to be detected passes through the regions 2, 3 and 4 without significant absorption and is absorbed by about 1 micron in thickness in the region 1. Each photon creates one pair of electron-hole. Since the potential − V is assumed to be sufficient to obtain the avalanche in the region 2 and not in the region 3, each electron travels towards earth. By contrast, the holes pass through the zone 2 where they trigger off the avalanche phenomenon.

The advantage of initiating the avalanche by the holes is that the noise caused by the amplification phenomenon is lower than in the case where it is initiated by the electrons.

In FIG. 3, the conductivity types are reversed, the substrate 100 being of the p$^+$- type (doping concentration $10^{18}$ at/cm$^3$). The layer 1 is of the p$^-$ type and has a thickness of the order of 10 microns. The layer 2 has a much greater thickness than in the previous case (1 to 2 microns) and an n− conductivity type and a doping concentration of the order of $10^{16}$ at/cm$^3$.

The layers 3 and 4 are of type n− and type n$^+$ conductivity, respectively (doping concentration $10^{15}$ and $10^{19}$ at/cm$^3$, respectively) and have the same thickness (5 microns, for example).

A potential + V is applied to the contact 6. As in the previous case, this results in reverse biassing of the diode, but the space charge region penetrates (equipotential + V) into the region 2 by virtue of its much greater thickness than in the previous case. The radiation is thus absorbed by the layer 2 itself and the field is at its maximum in the vicinity of the interface of the regions 1 and 2.

The holes created by the impact of the photons are entrained towards earth and bring about the avalanche in the region 2, as in the previous case. In both cases, the figures quoted are based on a radiation λ of wavelength substantially equal to $\lambda = 0.8$ μ (infrared).

The various materials used have a composition corresponding to the formula $Ga_{1-x}Al_xAs$, with $0 < x < 0.2$.

The diodes are obtained by liquid-phase epitaxy as described in U.S. patent application Ser. No. 526,929.

The characteristics of two examples described purely by way of illustration are summarised in the following Tables:

TABLE 1

| REGION | SUBSTRATE | EXAMPLE 1 1 | 2 | 3 | 4 |
|---|---|---|---|---|---|
| thickness | 500 | 5 | 0.1 | 5 | 5 |

TABLE 1-continued

| REGION | SUBSTRATE | EXAMPLE 1 | 2 | 3 | 4 |
|---|---|---|---|---|---|
| (μ) | | | | | |
| x | 0 | 0 | 0 or 0.2 | 0.2 | 0.2 |
| impurity type $\|N_D-N_A\|(cm^{-3})$ | n $10^{18}$ | n #$10^{16}$ | p $10^{17}$ to $10^{18}$ | p $<10^{15}$ | p $>10^{19}$ |
| purpose | — | detection | amplification | — | contact |

TABLE 2

| REGION | SUBSTRATE | EXAMPLE 2 1 | 2 | 3 | 4 |
|---|---|---|---|---|---|
| thickness (μ) | 500 | 10 | 1 to 2 | 5 | 5 |
| x | 0 | 0 | 0 | 0.2 | 0.2 |
| type of conductivity $\|N_D-N_A\|(cm^{-3})$ | p $>10^{18}$ | p $10^{18}$ | n $10^{16}$ | n $10^{15}$ | n $10^{19}$ |
| purpose | | | Detection and amplification | | contact |

What I claim is:

1. An avalanche photodiode for detecting incident radiation of a predetermined wavelength comprising superimposed, a first layer of a first type of conductivity and a second layer of a second type of conductivity opposite to the first, said layers having respective superimposed central portions, and inserted in one of said central portions a third layer forming a rectifying junction with said first layer, said third layer having a high impurity concentration, so that the electrical avalanche phenomenon is localized preferentially in said third layer for reverse biasing predetermined voltage values applied to said diode.

2. A diode as claimed in claim 1, wherein said second layer is exposed to said radiation, and being made of a semiconductor material having a forbidden band width greater than that of the materials of said other layers so as to be transparent to the radiation to be detected.

3. A diode as claimed in claim 2, wherein the conductivity types of said layers are selected in such a way that the avalanche phenomenon is triggered off by the displacement of holes within said third zone.

4. A diode as claimed in claim 3, wherein the thickness of the third layer is sufficiently thin to be transparent to the radiation, the radiation being absorbed in the first layer.

5. A diode as claimed in claim 4, wherein said first layer has type n-conductivity, said second and third layers having type p-conductivity, the first layer having a doping concentration of the order of $10^{16}$ at/cm$^3$, said second and said third layers having doping concentrations of the order of $10^{19}$ at/cm$^3$, the thickness of the third layer being of the order of 0.1 micron.

6. A diode as claimed in claim 3, wherein said third layer is sufficiently thick to absorb the radiation to be detected.

7. A diode as claimed in claim 6, wherein the first layer has p-type conductivity, the second and third layers have type n-conductivity, the doping concentrations being of the order of $10^{18}$ at/cm$^3$ and $10^{16}$ at/cm$^3$, respectively.

8. A diode as claimed in claim 1, wherein the layers are made of a compound corresponding to the formula $Ga_{1-x}Al_xAs$.

* * * * *